United States Patent
Dimitrovski

(10) Patent No.: US 10,110,186 B2
(45) Date of Patent: Oct. 23, 2018

(54) HARMONIC FILTER FOR MAGNETIC AMPLIFIER

(71) Applicant: UT Battelle, LLC, Oak Ridge, TN (US)

(72) Inventor: Aleksandar D. Dimitrovski, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 239 days.

(21) Appl. No.: 15/146,671

(22) Filed: May 4, 2016

(65) Prior Publication Data

US 2017/0324389 A1  Nov. 9, 2017

(51) Int. Cl.
*H03F 9/00* (2006.01)
*H03F 9/02* (2006.01)
*H02J 1/02* (2006.01)

(52) U.S. Cl.
CPC . *H03F 9/02* (2013.01); *H02J 1/02* (2013.01)

(58) Field of Classification Search
CPC ........................................................ H03J 9/00
See application file for complete search history.

(56) References Cited

U.S. PATENT DOCUMENTS

| | | | | |
|---|---|---|---|---|
| 4,675,615 A | * | 6/1987 | Bramanti | G01R 33/04 324/253 |
| 4,841,428 A | * | 6/1989 | Washburn | G05F 3/06 323/331 |
| 2013/0320940 A1 | * | 12/2013 | Dimitrovski | G05F 1/32 323/249 |

* cited by examiner

*Primary Examiner* — Hai L Nguyen
(74) *Attorney, Agent, or Firm* — Brinks Gilson & Lione

(57) ABSTRACT

A magnetic amplifier includes a permeable core having multiple legs. Control windings wound around separate legs are spaced apart and connected in series in an anti-symmetric relation. Harmonic filters are positioned adjacent to the control windings to attenuate even-ordered harmonics generated by alternating load current passing through a portion of the legs. The control windings bias magnetic flux arising from control current flowing through one of the control windings which is substantially equal to the biasing magnetic flux flowing into a second control winding. The flow of the control current through each of the control windings changes the reactance of the permeable core reactor by driving those portions of the permeable core that convey the biasing magnetic flux into saturation. The phasing of the control winding limits a voltage induced in the plurality of control windings caused by a magnetic flux passing around a portion of the permeable core.

21 Claims, 5 Drawing Sheets

HARMONIC FILTER FOR MAGNETIC AMPLIFIER

STATEMENT REGARDING FEDERALLY SPONSORED RESEARCH AND DEVELOPMENT

This application was made with United States government support under Contract No. DE-AC05-000R22725 awarded by the United States Department of Energy. The United States government has certain rights in these inventions.

BACKGROUND

Technical Field

This application relates to magnetic amplifiers, more particularly, to devices that filter unwanted harmonics created by magnetic amplifiers or other sources.

Related Art

Induced ac voltages in a dc circuit of a magnetic amplifier may cancel when the induced ac fluxes of the same magnitude and opposite polarity are summed. Cancellation occurs when the summed fluxes are perfectly sinusoidal no matter the connection.

However, due to the nonlinearity of magnetic amplifiers at or near the point of saturation, most ac fluxes are not completely sinusoidal. These ac fluxes contain harmonics. The flux components induce voltages with corresponding frequencies that result in currents containing harmonics when ac fluxes "add". The term harmonics is a general term that describes the distortion of a sinusoidal waveform by waveforms of different frequencies. The complex waveforms that are constructed by this "addition" can overheat and overpower conductors and worse yet, destroy the dc circuits controlling the magnetic amplifiers.

DETAILED DESCRIPTION OF THE PREFERRED EMBODIMENTS

The disclosed magnetic amplifiers use saturation in magnetic permeable cores to change the equivalent impedance of power lines and/or circuits. The impedance in one circuit/power line can change with a small change in current in another circuit. The change in impedance can result in a much larger current flow in that circuit. Hence, a small current in the control circuit can control a much larger current in the controlled circuit resulting in amplification.

The small current produced by a controllable dc source generates the bias magnetic flux that establishes the operating point of the magnetic amplifier. The larger in magnitude this flux becomes the more saturated the core of the magnetic amplifier becomes and the smaller the impedance the ac circuit gets. The dc bias flux adds with the flux created by the ac current in the controlled circuit. The latter affects the control circuit through a mutual induction that induces significantly high voltages in the control circuit. Such voltages are mitigated and substantially dampened by filtering the control winding or control leg of the permeable core. The filter attenuates even-ordered harmonics that would otherwise occur as in phase, add up, and induce high voltages in the control circuit.

The disclosed harmonic filter adapts to varying power loads (linear and non-linear loads), is generator compatible, and is energy efficient when driving full or partial loads. It is passive, has low impedance, and is compliant with IEEE-519. Configured like the internal auxiliary windings of the magnetic amplifier, the filter elements of the harmonic filter have substantially the same symmetrical configuration as the coils or windings of the control circuit and are positioned adjacent to them (e.g., above, below, within, around, etc.). But instead of being connected to a dc source and the control circuit, the filter elements are short-circuited.

Figure 1:
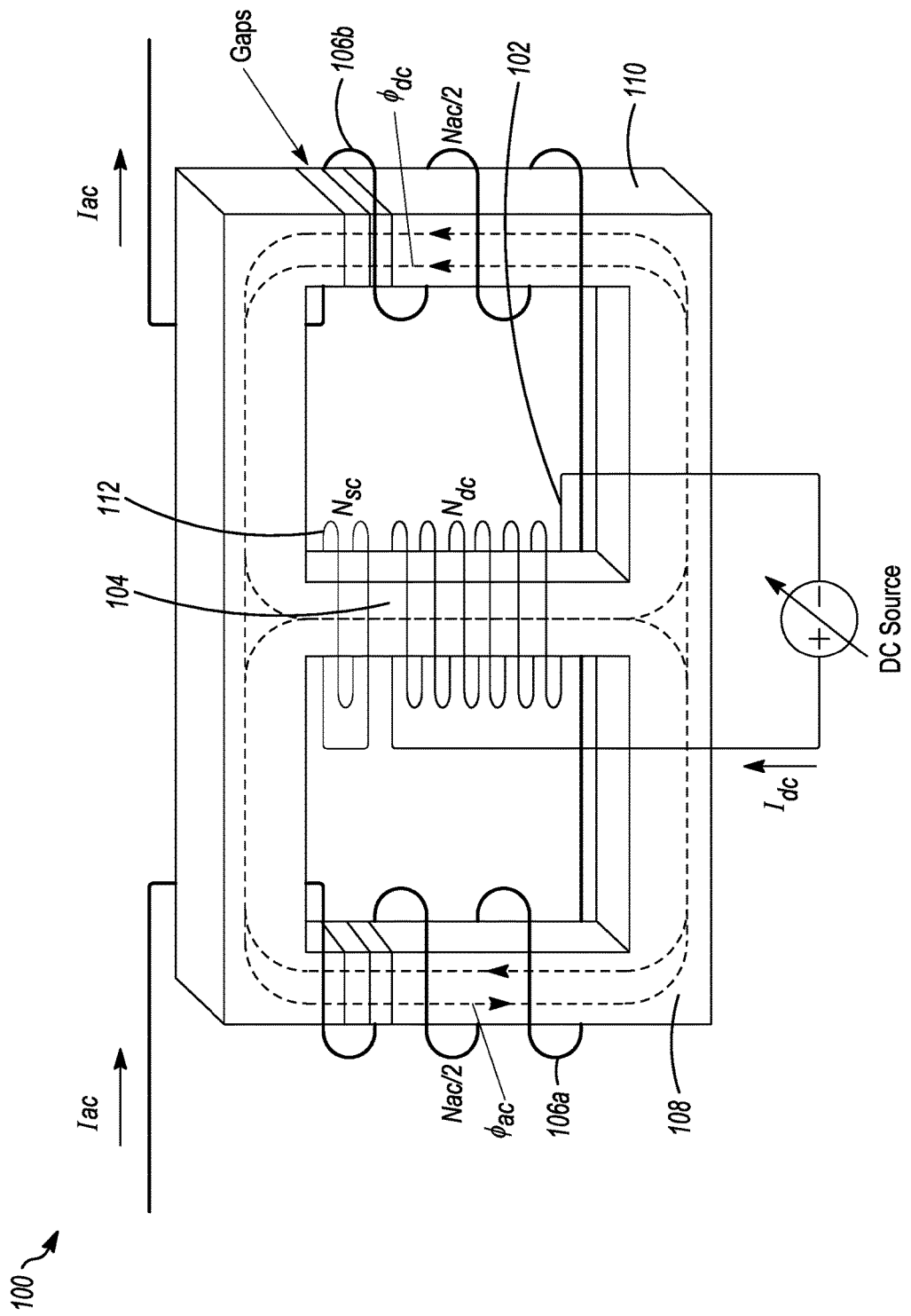
FIG. 1 is a magnetic amplifier with a harmonic filter.

A three-legged magnetic core 100 is shown in FIG. 1. In FIG. 1, a control circuit winding 102 has a coil spherically wound around a middle leg 104 of the magnetic permeable core. A controlled circuit having two coils 106a and 106b wound on a proximal and a distal leg 108 and 110. The controlled circuit coils 106a and 106b (e.g., the ac coils) are connected to produce in phase fluxes that add up and flow in a common direction. In ideal conditions, when the ac flux is perfectly sinusoidal, the ac fluxes flow only through the peripheral portions of the magnetic permeable core without entering the middle leg 104 and inducing an electromotive force (emf) in the control circuit winding 102. The dc bias flux, on the other hand, flows throughout the whole core and creates a "global" saturation.

To minimize and substantially dampen one or more even-ordered harmonics that may enter the middle leg 104, a harmonic filter 112 is positioned adjacent to the control circuit windings 102. In FIG. 1, the harmonic filter 112 is positioned above the control circuit winding 102. The harmonic filter 112 comprises coils having substantially the same symmetrical shape as the control circuit winding 102 tuned to the even-ordered harmonics but short-circuited. When an even-ordered harmonic imbalance in the ac flux occurs in the proximal and/or distal legs 108 and 110 that would otherwise be reflected to the control circuit, the harmonic filter 112 dampens them, by first isolating the even-ordered harmonics and then selecting the even-ordered harmonics via mutual induction and then substantially attenuating those harmonics via a closed loop low-resistance connection. The connection bridges the input to the output of the (electric) harmonic filter 112. The output characteristic of the harmonic filter 112 simulates a short-circuited secondary of a transformer with very low impedance. It results in the substantial cancellation of currents induced by the ac flux even-ordered harmonics.

Figure 2:
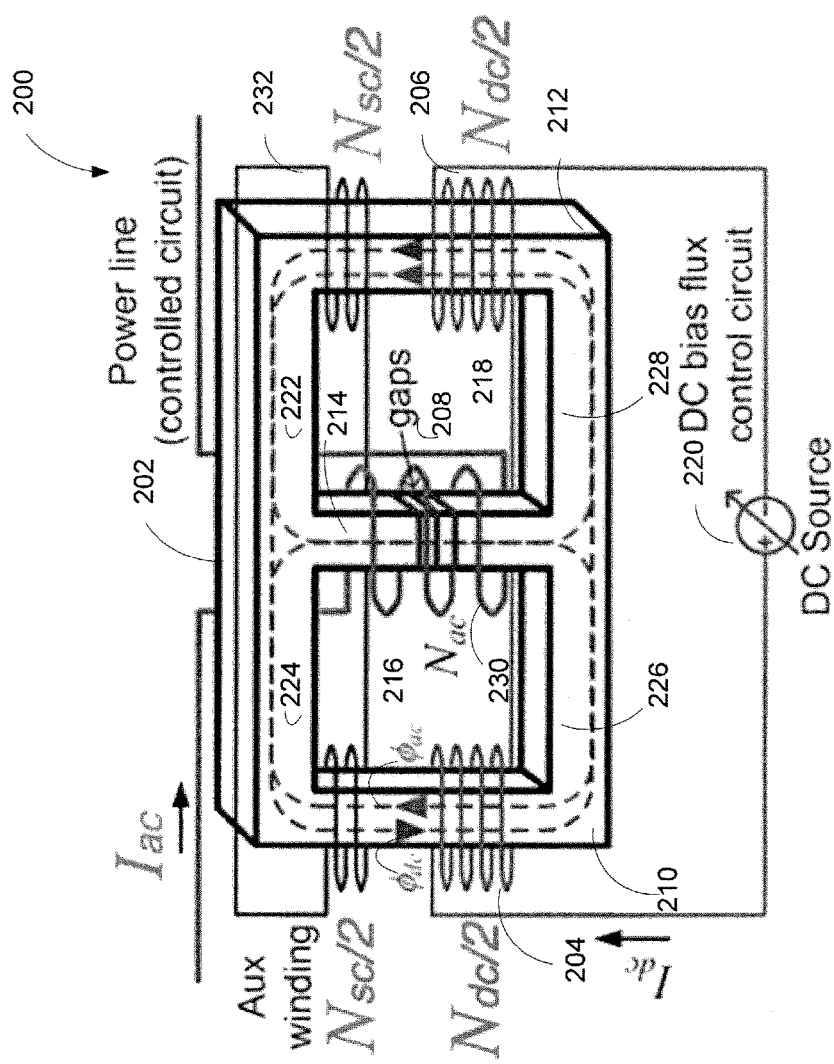
FIG. 2 is an alternative magnetic amplifier with a harmonic filter.

FIG. 2 is a front view of a second magnetic amplifier 200. The core of the magnetic amplifier 200 comprises a saturable magnetic material. In some magnetic amplifiers, the core may have different core geometries and structures and may be made of one or more magnetizing materials such as steel, iron, ferrous alloy(s), nickel iron, or other saturable materials for example. Different cross-sections of the core may have different saturation levels due to flux flow, use of saturable materials, positioning of gaps, and other factors.

The cross-sections may comprise many shapes and geometries that may include substantially rectangular, circular, or oval shapes, for example.

The magnetic amplifier 200 of FIG. 2 uses anti-symmetric dc control windings 204 and 206 and air-like portions 208 within selected portions of a magnetic permeable or saturable core 202 (hereinafter referred to as the saturable core 202) to control magnetic flux flow. The control windings 204 and 206 are anti-symmetric because the amount of dc magnetic flux flowing into one of the control windings is substantially equal to the amount of dc magnetic flux flowing out of a second and separate control winding. In one system, one of the control windings 206 as shown in FIG. 2 are cylindrical in form and are wound in a helix around a distal outer leg 212 of the saturable core 202 in a clockwise configuration and a second control winding 204 also cylindrical in form and comprising the same number of turns (or substantially the same number of turns) is wound in a helix around a proximal outer leg 210 of the saturable core 202. In this system, the outer legs 210 and 212 have substantially uniform magnetic cross-sections without the air gaps 208 or non-magnetic material shown in some of the alternating magnetic flux flow paths, which in FIG. 2 is positioned in the middle or center leg 214. In some magnetic amplifiers the non-magnetic material may comprise a porous non-ferromagnetic material that has substantially similar magnetic properties to air and may be placed in any area of the saturable core 202 seen only by the magnetic flux generated by the power winding.

The control windings 204 and 206 wound around the proximal and distal legs 210 and 212 may be positioned in a parallel or substantially parallel alignment with each other with each control winding separated by substantially symmetrical windows 216 and 218 that are bounded by the middle or center leg 214. When the control windings 204 and 206 are energized by a local power system (e.g., rectified from the ac source, but at a low voltage) or power system independent dc circuit or source 220, a bias magnetic flux is established in the proximal and distal legs 210 and 212 of the magnetic amplifier's core 202. This bias magnetic flux (also referred to as the "dc flux" in dc applications) passes through the joining portions 222-228 of the core 202, such that the dc flux generated by one control winding is substantially the same amount of dc flux received by the second control winding. The voltage, current, and power that source the control windings 204 and 206 is sufficiently low enough because the dc flux does not pass through or is substantially dampened by the air gaps 208 or non-magnetic material shown in the center leg 214 of FIG. 1 (e.g., it does not pass through a substantial portion of the center leg 214). When saturation is reached, the portion of the core 202 in which substantially all of the direct current flux flows acts like an open space or an air gap. Since the direct flux flow path also conveys some of the alternating magnetic flux, the simulated air gap changes the reluctance and lowers the reactance (voltage drop) seen in the power winding 230.

More particularly the alternating magnetic flux flow and direct current magnetic flux flow is shown in FIG. 2. The split core 202 has three legs (a distal leg 212, a middle or center leg 214, and a proximal leg 210) and four joining portions 222-228. When the core 202 is not saturated, the alternating current flowing through the power winding 230 will generate an alternating magnetic flux proportional to the alternating current flow that will flow through the legs 210-214 and joining portions 222-228 of the core 202. Before reaching saturation a change in the alternating current creates a corresponding change in the alternating magnetic flux that generates an electromotive force that opposes change in alternating current flow in the power winding 230. When the control windings 204 and 206 saturate portions of the core 202, the portion of the core 202 in which the direct current flux flows becomes saturated. Since the alternating current magnetic flux flows throughout the entire core 202 of the magnetic amplifier 200, the portion of the core 202 in which the direct current flux flows is a shared path (e.g., in FIG. 1 the shared path comprises the distal and proximal legs 210 and 212 and the joining portions 222-228). Saturation of the shared path impedes the alternating magnetic flux flow through these alternating magnetic flux flow paths resulting in smaller equivalent impedance to the alternating current flowing through the power winding 230. The saturated portions simulate an air core having a reluctance of about three to four orders of magnitude smaller (e.g., $10^3$-$10^4$, thousand to ten thousand times) than when the portions are not saturated.

In FIG. 2, a dc control circuit 220 that is magnetically coupled to the alternating current circuit controls the saturation of portions of the core 202. The dc control circuit 220 may include a local embedded or external power electronic converter such as an ac/dc converter or rectifier that may change the voltage, current, and frequency of the alternating source sourcing the alternating current Iac that is shown in response to processor or a manual command. A change in the amount of biasing magnetic flux produced by the current flowing through the dc circuit 220 changes the reactance in the alternating current circuit. As a result, the current flow through the alternating current circuit will change in correspondence to the changed reactance. The reactance may range from a magnitude that is equivalent to an air core (e.g., an air core inductance) when portions of the core are saturated, to a reactance that of three to four orders of magnitude larger. In FIG. 2 the range of control of the alternating current flow through the power winding 230 may depend on the ratio of reactor impedance to the total impedance in circuit. In some applications, the range of current (and/or voltage control) may depend on the range of change in the reluctance of the core 202. The level of incremental control of the inductance (or reactance) may also depend on the level of control of the dc biasing current.

To minimize and substantially dampen one or more even-ordered harmonics that may enter the distal and proximal legs 210 and 212, a distributed harmonic filter 232 is positioned adjacent to the anti-symmetric dc control windings 204 and 206. In FIG. 2, the distributed harmonic filter 232 (designated as a distributed shading coil—SC) is positioned above the anti-symmetric dc control windings 204 and 206. The distributed harmonic filter 112 comprises two (or more) coils of "N" windings ($N_{sc}/2$) having substantially the same cylindrical and symmetrical shape as the anti-symmetric dc control windings 204 and 206 but short-circuited. When an even-ordered harmonic imbalance in the ac flux occurs in the distal and/or proximal legs 210 and/or 212 that would otherwise be reflected to the dc circuit 220, the distributed harmonic filter 232 dampens them, by first isolating and then selecting even-ordered harmonics via mutual induction and then substantially attenuating those harmonics via a closed loop low-resistance connection. The connection bridges the input to the output of the (electric) distributed harmonic filter 232. The output characteristic of the harmonic filter 232 simulates a short-circuited secondary of a transformer with very low impedance. It results in the substantial cancellation of currents induced by the ac flux even-ordered harmonics.

In operation, the currents induced in the harmonic filter 232 will produce the same amount of counter flux that will restore the balance and, therefore, "shade" the anti-symmetric dc control windings 204 and 206. At the same time, the distributed harmonic filter 232 is transparent to the dc bias flux created by the dc circuit 220 and to the fundamental sinusoidal flux created by the controlled circuit (the power winding 230). Hence, the harmonic filter 232 does not impede the operation of the magnetic amplifier 200.

The "shading" coil(s) that are part of the distributed harmonic filter 232 is shown above the anti-symmetric dc control windings 204 and 206 in FIG. 2. The placement of distributed harmonic filter 232 may also be positioned around the inner and/or outer periphery of the anti-symmetric dc control windings 204 and 206. In these systems the distributed harmonic filter 232 will also provide electrostatic shading or insulation in addition to the electromagnetic and shield any sensitive control circuit from harmful external transients that can occur in a power system or power line.

Figure 3:
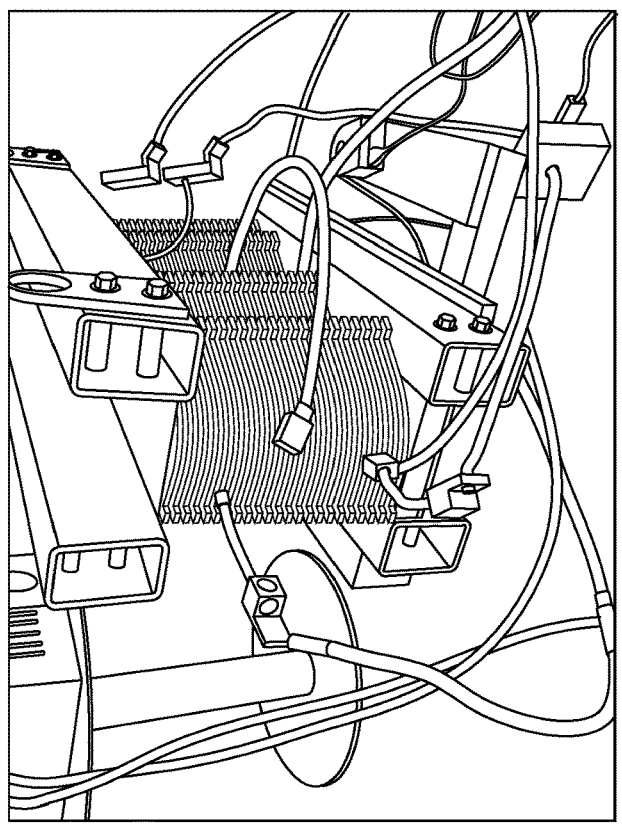
FIG. 3 a single-phase four-legged magnetic amplifier with harmonic filters.
Figure 3:
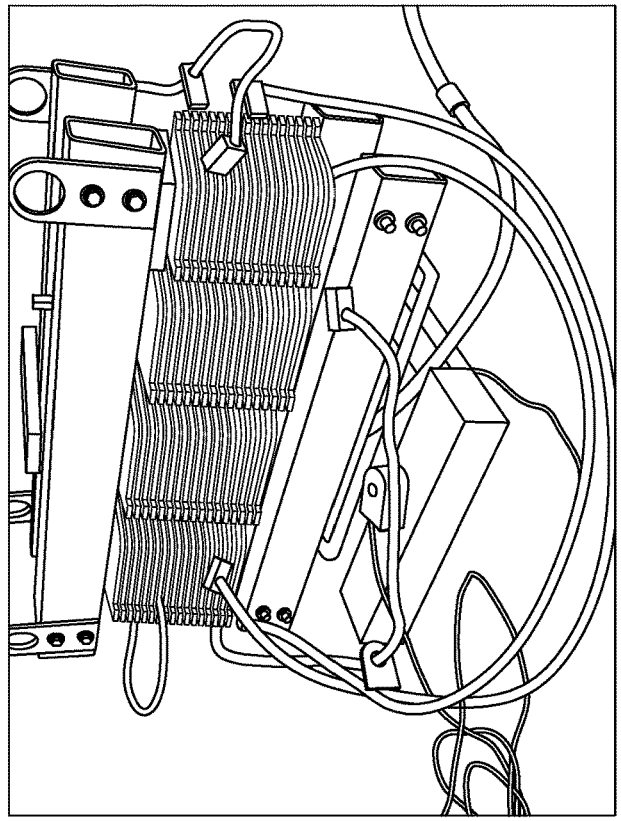
Figure 5:
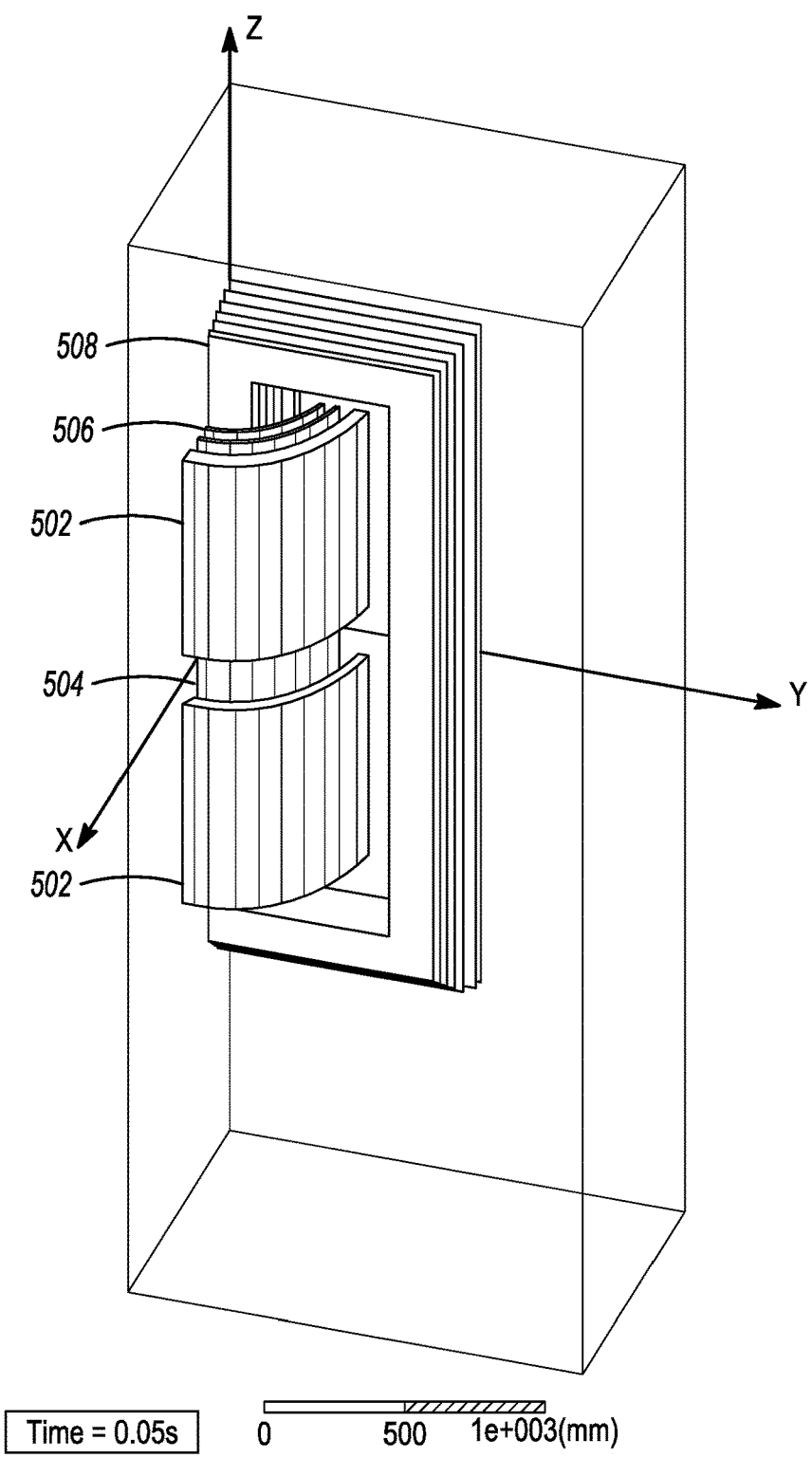
FIG. 5 is a third alternative magnetic amplifier with a harmonic filter, control coils, and controlled coils wound concentrically around a common leg.

The same principle of harmonic filtering with an auxiliary winding that is connected in the same or symmetrical way as the dc winding is applicable to other types of magnetic amplifiers. FIG. 3 shows a four-legged magnetic amplifier. This system has ac windings with two coils on the middle legs connected in parallel and dc winding two coils on the outer legs connected as in FIG. 2. The auxiliary winding with two harmonic filters are also connected and placed as in FIG. 2. FIG. 5 shows a single leg gapless core magnetic amplifier, with all of the coils (e.g., the shading coils, control coils, and controlled coils are wound around a common leg (magnetic permeable core) 508 comprised of magnetic permeable laminates. The split controlled coils 502 shown as ac winding are connected in series in an anti-symmetric relation around the permeable core at 508. In other words, the split controlled coils 502 or power windings are connected in counter-series (anti-series) on top. Underneath the controlled windings (e.g., the ac winding) is the harmonic filter 504. The harmonic filter 504 (like harmonic filter 112) comprises coils having substantially the same symmetrical shape as the split controlled coils 502 tuned to the even-ordered harmonics but short-circuited. Underneath the harmonic filter 504 are the control (dc) windings 506.

Figure 4:
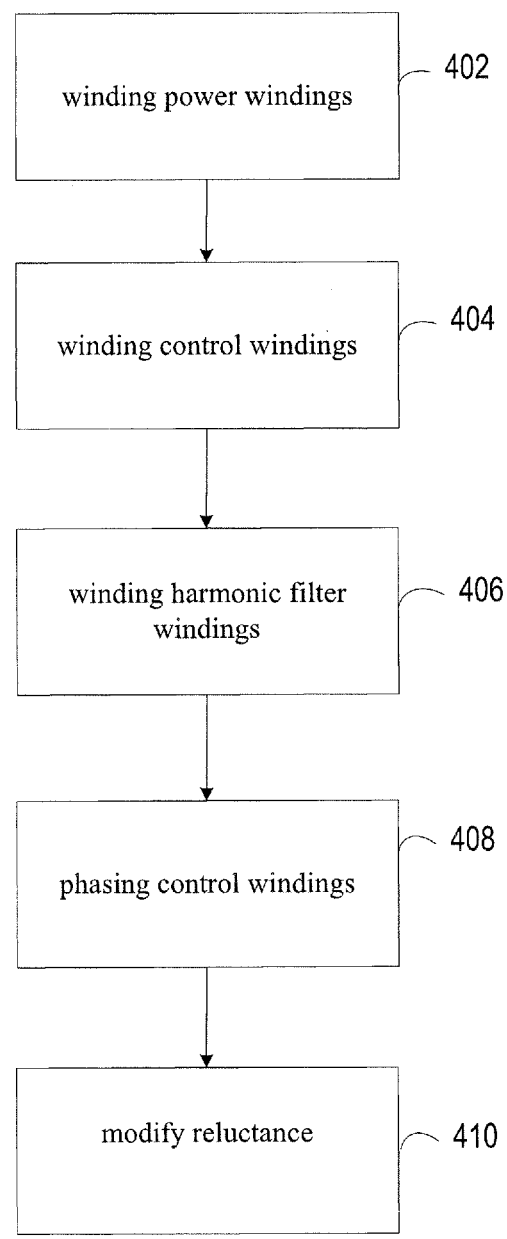
FIG. 4 is means for controlling high-voltage power flow through power lines.

A method/process/means of controlling high-voltage power flow through power lines is shown in FIG. 4. The process includes winding power windings that receives high voltage alternating current from a high voltage power line and delivers an alternating load current to a load about a permeable core at 402. The process winds a plurality of control windings in parallel around a separate leg of the permeable core that are spaced apart from each other and a power winding and connected in series in an anti-symmetric relation around the permeable core at 404. The windings are configured in such that substantially all of the biasing magnetic flux arising from a control current flowing through the plurality of control windings does not flow through the leg which the power winding is wound about. At 406, the process winds a harmonic filter's winding adjacent to and symmetrical to each of the plurality of control windings, the harmonic filter windings are configured to attenuate even-ordered harmonics passively. At 408 the process phases the plurality of control windings in such a way to cancel out a voltage induced in the plurality of control windings caused by the alternating load current passing through the power winding. And, at 410 the process changes the reluctance of the permeable core and impedance of the power winding by driving only those portions of the permeable core that convey the biasing magnetic flux into saturation.

The magnetic materials used in the magnetic amplifier 200 and processes described herein may have or process a high magnetic permeability and low coercivity. The magnetic amplifier 200 is installed or processed in-line or in series with any power line including high voltage (>1 kV), extra high voltage (>230 kV), or ultra-high voltage (>765 kV) power distribution and transmission lines. The small relative size of the magnetic amplifier 200 relative to some typical constructions that control high voltage power flow may allow the magnetic amplifiers to be installed with an enclosure at the elevated potential of the power line voltage. The magnetic amplifiers 100 and 200 and processes may be deployed system wide in a distributed power system architecture and may be self-monitored and controlled. Some magnetic amplifiers and processes are remotely monitored and controlled through a wireless or physical communication link from one or more geographically remote locations.

When used in connected networks, one, two, or more (e.g., several) magnetic amplifiers or saturable reactors may effectively control current and power flow in a power system, power lines, and/or transmission grid. Through the use of local transducers and/or local sensors that may monitor and record transmissions line states (e.g., current flow, voltage range, thermal conditions, etc.) and local controller devices (e.g., processor, computer, etc.) and transceivers interfaced to the local electronic power converters that may control the bias currents (e.g., ac or dc) of one or more magnetic amplifiers/saturable reactors, the operating conditions of the high voltage transmission lines may be monitored and adjusted through a wireless and/or physical bus.

The method/process/means described herein have been implemented in combinations of hardware, software and both hardware and software that control the manufacture and/or operation of the disclosed magnetic amplifiers and harmonic filters including SN 13984196 describing power flow control using distributed saturable reactors that is incorporated herein by reference. All or parts of the method/process/means have been executed controllers, one or multiple microprocessors (CPUs) that include a multithreaded hardware accelerator that supports multiple hardware and software threads that interface. The shared memory of this architecture can scale to large data and enable uniform low-latency access to some or all the data stored in memory. Its highly scalable I/O port receives and can transmit data at high rates (e.g., 350 TB/hr).

The term "coupled" disclosed in this description may encompass both direct and indirect coupling. Thus, first and second parts are said to be coupled together when they directly contact one another or share electromagnetic field, as well as when the first part couples to an intermediate part which couples either directly or via one or more additional intermediate parts to the second part. The term "position," "location," or "point" may encompass a range of positions, locations, or points. The term "substantially" or "about" may encompass a range that is largely, but not necessarily wholly, that which is specified as between one and five percent. It encompasses all but a significant amount. When devices are responsive to commands events, and/or requests, the actions and/or steps of the devices, such as the operations that devices are performing, necessarily occur as a direct or indirect result of the preceding commands, events, actions, and/or requests. In other words, the operations occur as a result of the preceding operations. A device that is responsive to another requires more than an action to (i.e., the device's response to) merely follow another action.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

The claims are as follows:

1. A magnetic amplifier that controls high-voltage power flow comprising:
   a magnetic permeable core, the core comprising a plurality of legs; and
   a plurality of control windings, each wound around a separate leg, spaced apart from each other and connected in series in an anti-symmetric relation such that a biasing magnetic flux arising from a direct current flowing through one of the plurality of control windings is substantially equal to the biasing magnetic flux flowing into a second of the plurality of control windings;
   a plurality of harmonic filters tuned to attenuate even-ordered harmonics generated by an alternating load current passing about a portion of the magnetic permeable core; each of the plurality of harmonic filters positioned directly adjacent to the each of the plurality of control windings;
   where flow of the control current through each of the plurality of control windings changes the reluctance of the magnetic permeable core by driving those portions of the magnetic permeable core that convey the biasing magnetic flux in the magnetic permeable core into saturation; and
   the phasing of the plurality of control winding cancels out or limits a voltage induced in the plurality of control windings caused by the alternating load current passing through a portion of the magnetic permeable core.

2. The magnetic amplifier of claim 1 further comprising a power winding spaced apart from the plurality of control windings and a single winding comprising the harmonic filter on one of the plurality of legs of the magnetic permeable core.

3. The magnetic amplifier of claim 2 where the flow of the control current through the plurality of control windings changes the level of the load current passing to a load.

4. The magnetic amplifier of claim 3 where the magnetic portions of the legs around which the plurality of control windings are wound, relative to the leg which the power winding is wound around, have substantially equal levels of saturation.

5. The magnetic amplifier of claim 3 where the level of saturation of the leg which the power winding is wound around is different than the level of saturation of the legs about which the plurality of control windings are wound around when the portions of the magnetic permeable core that convey the biasing magnetic flux are in saturation.

6. The magnetic amplifier of claim 1 where the harmonic filter isolates and attenuates the even-ordered harmonics through a mutual induction.

7. The magnetic amplifier of claim 1 further comprising a power converter coupled to the plurality of control windings, the power converter programmed to dampen transients detected in the alternating current by increasing or decreasing the reluctance of the permeable core and a power winding impedance in response to fluctuations in the alternating load current.

8. The magnetic amplifier of claim 1 further comprising a power converter coupled to the plurality of control windings, the power converter programmed to dampen the alternating current when a fault is detected in a high voltage power line conveying the alternating current.

9. The magnetic amplifier of claim 1 further comprising two magnetic amplifiers and a plurality of power converters, each of the plurality of power converters being coupled to one of the two magnetic amplifiers and the plurality of control windings, the power converters being programmed to vary induction and balance the phase of a three phase circuit.

10. A magnetic amplifier that controls high-voltage power flow through power lines comprising
    a permeable core the permeable core comprising a plurality of legs;
    a power winding wound around a leg of the permeable core that receives high voltage alternating current from high voltage power lines and delivers an alternating load current to a load; and
    a plurality of control windings, each wound in parallel around a separate leg, spaced apart from each other and the power windings, and connected in series in an anti-symmetric relation about the permeable core such that substantially all of the biasing magnetic flux arising from a control current flowing through the plurality of control windings does not flow through the leg which the power winding is wound about; and
    a plurality of harmonic filters where each of the harmonic filters are positioned adjacent to only one of the plurality of control windings;
    where the of harmonic filters comprise tuned filters that attenuate even-ordered harmonics generated by an alternating load current passing through a portion of the permeable core;
    where a phasing of the plurality of control winding cancel out a voltage induced in the plurality of control windings caused by the alternating load current passing through the power windings.

11. The magnetic amplifier of claim 10 further comprising a power converter coupled to the plurality of control windings.

12. The magnetic amplifier of claim 10 further comprising a power converter coupled to the plurality of control windings, the power converter programmed to dampen transients detected in the alternating current by increasing or decreasing the reluctance of the permeable core in response to fluctuations in the alternating load current.

13. The magnetic amplifier of claim 10 further comprising a power converter coupled to the plurality of control windings, the power converter programmed to dampen the alternating current when a fault in a high voltage power line is detected.

14. The magnetic amplifier of claim 10 where the harmonic filter isolates and attenuates the even-ordered harmonics through a mutual induction.

15. The magnetic amplifier of claim 14 where the harmonic filter isolates and attenuates the even-ordered harmonics through a low resistance short-circuit.

16. A method of controlling high-voltage power flow through power lines comprising:
    winding a plurality of control windings around a plurality of parallel legs of a permeable core, each of the windings being wound around a separate leg, spaced apart from each other and connected in series in an anti-symmetric relation such that a biasing magnetic flux arising from a control current flowing through one of the plurality of control windings is substantially equal to the biasing magnetic flux flowing into a second of the plurality of control windings;

filtering and attenuating even-ordered harmonics flowing through the legs in which the control windings encircle through a harmonic filter;

phasing of the plurality of control windings to dampen or limit a voltage induced in the plurality of control windings caused by an alternating load current passing about a portion of the permeable core; and changing the reactance of the permeable core reactor by driving those portions of the permeable core that convey the biasing magnetic flux in the permeable core into saturation.

17. A method of controlling high-voltage power flow through power lines comprising:

winding power windings that receives high voltage alternating current from a high voltage power line and delivers an alternating load current to a load about a permeable core;

winding a plurality of control windings in parallel around a separate leg of the permeable core that are spaced apart from each other and a power winding and connected in series in an anti-symmetric relation around the permeable core such that substantially all of the biasing magnetic flux arising from a control current flowing through the plurality of control windings does not flow through the leg which the power winding is wound about;

winding a harmonic filter winding adjacent to and symmetrical to each of the plurality of control windings, the harmonic filter windings configured to attenuate even-ordered harmonics passively;

phasing of the plurality of control windings in such a way to cancel out a voltage induced in the plurality of control windings caused by the alternating load current passing through the power winding; and changing the reluctance of the permeable core and impedance of the power winding by driving only those portions of the permeable core that convey the biasing magnetic flux into saturation.

18. A non-superconductive saturable reactor for controlling power flow in a high voltage power line with large impedance gains comprising:

a magnetizable core coupled to an ac and a dc flux path that flows through the magnetizable core; and a harmonic filter tuned to attenuate even-ordered harmonics generated by an alternating load current passing about a portion of the magnetizable core;

wherein a bias dc winding wound in a split core leg of the magnetizable core creates local magnetic flux that saturates the magnetizable core only in that part that conveys the dc flux path, the saturation of part of the magnetizable core causes the saturation of a portion of the ac flux path.

19. The non-superconductive saturable reactor of claim 18 where the harmonic filter isolates and attenuates the even-ordered harmonics through a mutual induction.

20. The non-superconductive saturable reactor of claim 18 where the harmonic filter isolates and attenuates the even-ordered harmonics through a low resistance short-circuit.

21. A magnetic amplifier that controls high-voltage power flow through power lines comprising a permeable core;

a power winding wound around the permeable core that receives high voltage alternating current from high voltage power lines and delivers an alternating load current to a load; and a plurality of control windings spaced apart from each other and the power windings, and connected in series in an anti-symmetric relation about the permeable core; and a harmonic filter configured to attenuate even-ordered harmonics generated by an alternating load current passing through a portion of the permeable core;

where a phasing of the plurality of control winding cancel out a voltage induced in the plurality of control windings caused by the alternating load current passing through the power windings.

* * * * *